US008007166B2

(12) United States Patent
Abbink et al.

(10) Patent No.: US 8,007,166 B2
(45) Date of Patent: Aug. 30, 2011

(54) METHOD FOR OPTIMIZING DIRECT WAFER BOND LINE WIDTH FOR REDUCTION OF PARASITIC CAPACITANCE IN MEMS ACCELEROMETERS

(75) Inventors: Henry C. Abbink, Westlake Village, CA (US); Gabriel M. Kuhn, West Hills, CA (US); Howard Ge, Alhambra, CA (US); Daryl Sakaida, Simi Valley, CA (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 483 days.

(21) Appl. No.: 11/914,932

(22) PCT Filed: May 24, 2006

(86) PCT No.: PCT/US2006/020084
§ 371 (c)(1),
(2), (4) Date: Nov. 19, 2007

(87) PCT Pub. No.: WO2006/127814
PCT Pub. Date: Nov. 30, 2006

(65) Prior Publication Data
US 2008/0184778 A1 Aug. 7, 2008

Related U.S. Application Data

(60) Provisional application No. 60/684,431, filed on May 25, 2005.

(51) Int. Cl.
*G01N 25/06* (2006.01)
*G01N 25/14* (2006.01)
(52) U.S. Cl. .................. 374/5; 374/45; 374/57

(58) Field of Classification Search .......... 374/4, 5, 374/100, 57, 178, 135, 137, 134, 43–45, 374/110, 112, 115, 166–167, 7, 10–11, 29–30, 374/141; 73/40, 592; 204/298.03; 361/687; 324/500, 759, 750, 763, 765, 557; 252/964, 252/960; 702/35, 40
See application file for complete search history.

(56) References Cited

U.S. PATENT DOCUMENTS

| | | | | |
|---|---|---|---|---|
| 4,152,477 A * | 5/1979 | Haruta et al. | ................. | 428/206 |
| 5,246,291 A * | 9/1993 | Lebeau et al. | ................... | 374/5 |
| 5,827,951 A * | 10/1998 | Yost et al. | ................... | 73/53.01 |
| 6,287,437 B1 * | 9/2001 | Pandhumsoporn et al. | ........................ | 204/298.13 |
| 6,491,426 B1 * | 12/2002 | Schonath et al. | ............... | 374/45 |
| 6,502,983 B2 * | 1/2003 | Yu | ................... | 374/44 |
| 6,821,802 B2 * | 11/2004 | Ahn et al. | ........................ | 438/27 |
| 6,879,048 B2 * | 4/2005 | Jordan et al. | ................... | 257/778 |
| 6,912,778 B2 * | 7/2005 | Ahn et al. | ........................ | 29/852 |
| 7,287,903 B2 * | 10/2007 | Estes et al. | ....................... | 374/11 |

(Continued)

FOREIGN PATENT DOCUMENTS

EP 0 369 352 A1 5/1990

(Continued)

*Primary Examiner* — Gail Verbitsky

(57) ABSTRACT

A method for optimizing direct wafer bond line width for reduction of parasitic capacitance in a MEMS device by reducing the width of a bond line between a first and a second wafer, exposing the MEMS device to a water vapor for a predetermined time period and at a first temperature capable of evaporating water, cooling the MEMS device at a second temperature capable of freezing the water, and operating the MEMS device at a third temperature capable of freezing the water to determine if there is discontinuity during operation.

12 Claims, 6 Drawing Sheets

U.S. PATENT DOCUMENTS

| | | | |
|---|---|---|---|
| 7,338,818 B2 * | 3/2008 | Arroyo et al. | 438/14 |
| 7,416,984 B2 * | 8/2008 | Martin et al. | 438/691 |
| 7,425,093 B2 * | 9/2008 | Wickersham et al. | 374/5 |
| 7,443,017 B2 * | 10/2008 | Haluzak et al. | 257/680 |
| 7,651,260 B2 * | 1/2010 | Hamann et al. | 374/5 |
| 7,654,734 B2 * | 2/2010 | Jiang et al. | 374/5 |
| 7,732,713 B2 * | 6/2010 | Grube et al. | 174/267 |
| 2006/0292748 A1 * | 12/2006 | Haluzak et al. | 438/116 |
| 2008/0141759 A1 * | 6/2008 | Reinert et al. | 73/40 |
| 2008/0191729 A1 * | 8/2008 | Blanco et al. | 324/765 |
| 2009/0090409 A1 * | 4/2009 | Moczygemba | 136/201 |
| 2009/0194309 A1 * | 8/2009 | Gillot et al. | 174/50 |
| 2010/0046574 A1 * | 2/2010 | Hamann et al. | 374/43 |
| 2010/0066393 A1 * | 3/2010 | Bottoms et al. | 324/754 |
| 2011/0000283 A1 * | 1/2011 | van 't Oever et al. | 73/40 |

FOREIGN PATENT DOCUMENTS

| | | |
|---|---|---|
| EP | 0 611 221 A1 | 8/1994 |
| EP | 1 279 941 A2 | 1/2003 |
| EP | 1 524 511 A2 | 4/2005 |

* cited by examiner

US 8,007,166 B2

METHOD FOR OPTIMIZING DIRECT WAFER BOND LINE WIDTH FOR REDUCTION OF PARASITIC CAPACITANCE IN MEMS ACCELEROMETERS

CROSS REFERENCE TO RELATED APPLICATIONS

This application claims the benefit of Provisional Application No. 60/684,431, filed May 25, 2005, herein incorporated by reference in its entirety.

BACKGROUND OF THE INVENTION

1. Field of the Invention

The invention relates generally to Micro-Electro-Mechanical Systems (MEMS). More particularly, the invention relates to a method for optimizing wafer bond line width for reduction of parasitic capacitance in MEMS accelerometers.

2. Description of Related Art

Micro-Electro-Mechanical Systems (MEMS) is the integration of mechanical elements, sensors, actuators, and electronics on a common silicon substrate through microfabrication technology. The electronics in a MEMS device are fabricated using Integrated Circuit (IC) technology (CMOS, Bipolar, or BICMOS processes), while the micromechanical components are fabricated using "micromachining" techniques that selectively etch away or add new layers to the silicon wafer to form mechanical and electromechanical devices.

MEMS devices are widely used in automotives, navigation systems, chemical and biological sensors, microoptics, accelerometers, pressure sensors and other devices. A common approach to fabrication of MEMS devices is the so-called bulk MEMS process. This process consists of processing two or three silicon wafers with patterns machined by Deep Reactive Ion Etching (DRIE) to form the structure used in each layer, and then bonding these layers together by a process called direct bonding to form a hermetic cavity.

SUMMARY OF THE INVENTION

A process for optimizing direct wafer bond line width for reduction of parasitic capacitance in a MEMS device. The process involves reducing the width of a bond line between a first and a second wafer, exposing the MEMS device to water vapor for a predetermined time period and at a first temperature capable of evaporating the water, cooling the MEMS device at a second temperature capable of freezing the water, and operating the MEMS device at a third temperature capable of freezing the water to determine if there is discontinuity during operation.

In one embodiment the bond line width is reduced to approximately 100-200 microns. To optimize direct wafer bond, a different bond line width can be used to determine its operability and reliability at design conditions.

In another embodiment the first temperature used for evaporating water is approximately 100° C. The second temperature can approximately be below 0° C., preferably about −55° C. The third temperature can be approximately equal to the second temperature.

The process further includes a method of calculating the leak rate through the bond line by dividing the volume of fluid in the MEMS device by the predetermined time period. To achieve an acceptable leak rate, a different bond line width of the MEMS device can be used to reduce discontinuity during operation and achieve optimum operability and reliability of the MEMS device.

BRIEF DESCRIPTION OF THE DRAWINGS

The exact nature of this invention, as well as the objects and advantages thereof, will become readily apparent from consideration of the following specification in conjunction with the accompanying drawings in which like reference numerals designate like parts throughout the figures thereof and wherein.

DETAILED DESCRIPTION OF THE PREFERRED EMBODIMENTS

Methods and systems that implement the embodiments of the various features of the invention will now be described with reference to the drawings. The drawings and the associated descriptions are provided to illustrate embodiments of the invention and not to limit the scope of the invention. Reference in the specification to "one embodiment" or "an embodiment" is intended to indicate that a particular feature, structure, or characteristic described in connection with the embodiment is included in at least an embodiment of the invention. The appearances of the phrase "in one embodiment" or "an embodiment" in various places in the specification are not necessarily all referring to the same embodiment. Throughout the drawings, reference numbers are re-used to indicate correspondence between referenced elements. In addition, the first digit of each reference number indicates the figure in which the element first appears.

Figure 1:
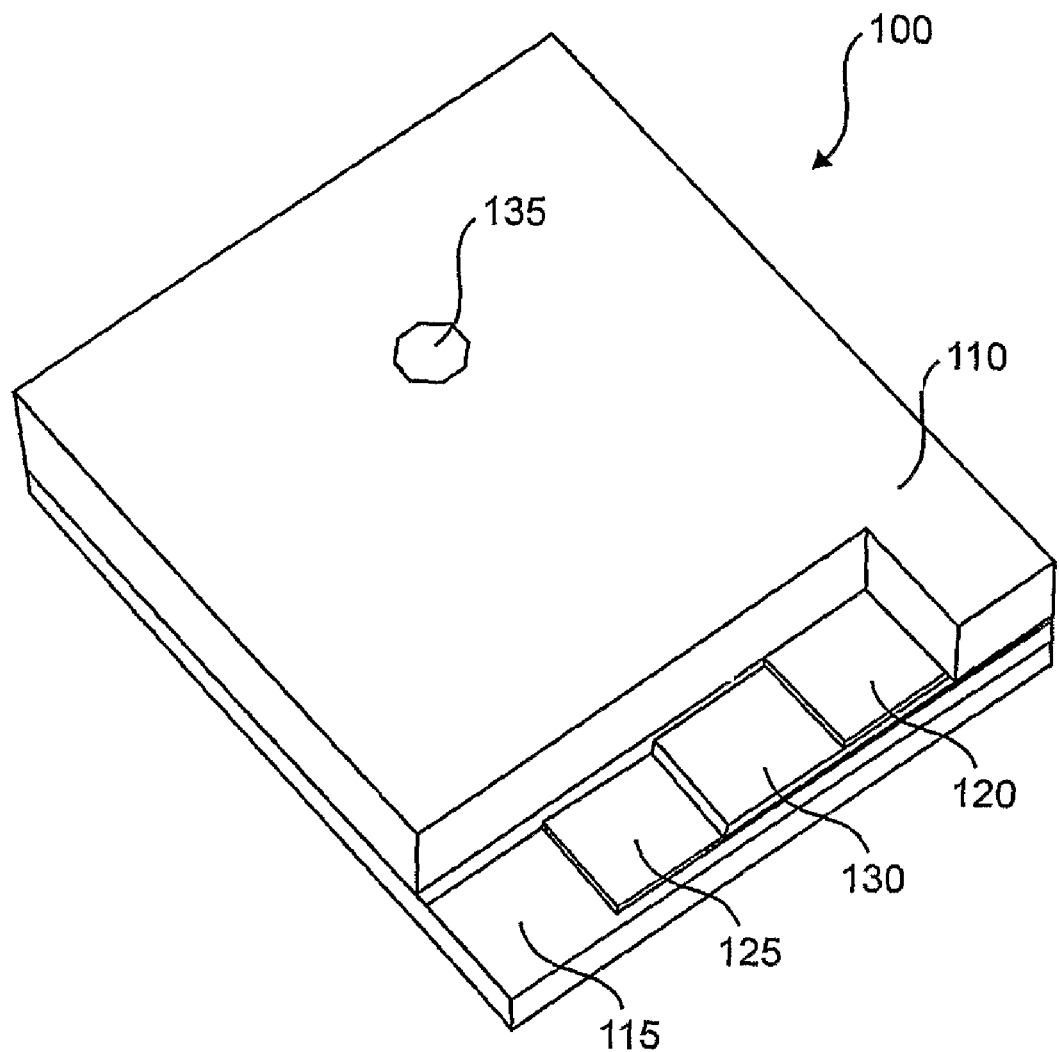
FIG. 1 is a perspective view of a prior art silicon accelerometer sensor.

FIG. 1 is a perspective view of a prior art silicon accelerometer sensor 100 before assembly. The sensor 100 has a first outside layer 110, a second outside layer 115, a first guard layer 120, a second guard layer 125, and a proof mass layer 130. The proof mass layer 130 is sandwiched between the first and second guard layers 120 and 125, which are then sandwiched between the first and second outside layers 110 and 115. The sensor 100 also has a via 135 to facilitate a path or opening for circuit shorting. The sensor 100 is fabricated from two silicon-on-insulator (SOI) wafers and one prime silicon wafer. The SOI wafers provide the first and second outside layers 110 and 115, and the first and second guard layers 120 and 125. The prime silicon wafer provides the proof mass layer 130.

On the surface of each wafer layer 110-130 is a layer of oxide, typically 1 micron thick. When the layers 120-130 are bonded together, a 2 micron layer of oxide is formed between the guard layers 120 and 125 and the proof mass layer 130.

One technique to bond all the wafer layers 110-130 together is by a process called direct bonding. Before bonding, the wafer layers 110-130 are preferably cleaned and activated. Activation is done by either chemical or plasma surface activation. The wafer layers 110-130 are properly aligned and coupled to each other. Van Der Waals forces will cause the layers 110-130 to bond to each other. Since the Van Der Waals forces are relatively weak, the wafer layers 110-130 may be annealed at an elevated temperature. This temperature depends on the activation process. Older processes used temperatures in excess of 1000° C. With newer plasma processes, 400° C. may suffice. It can be envisioned that other methods or techniques can be used to bond the layers 110-130 together and achieve the same objective of the present invention.

Figure 2:
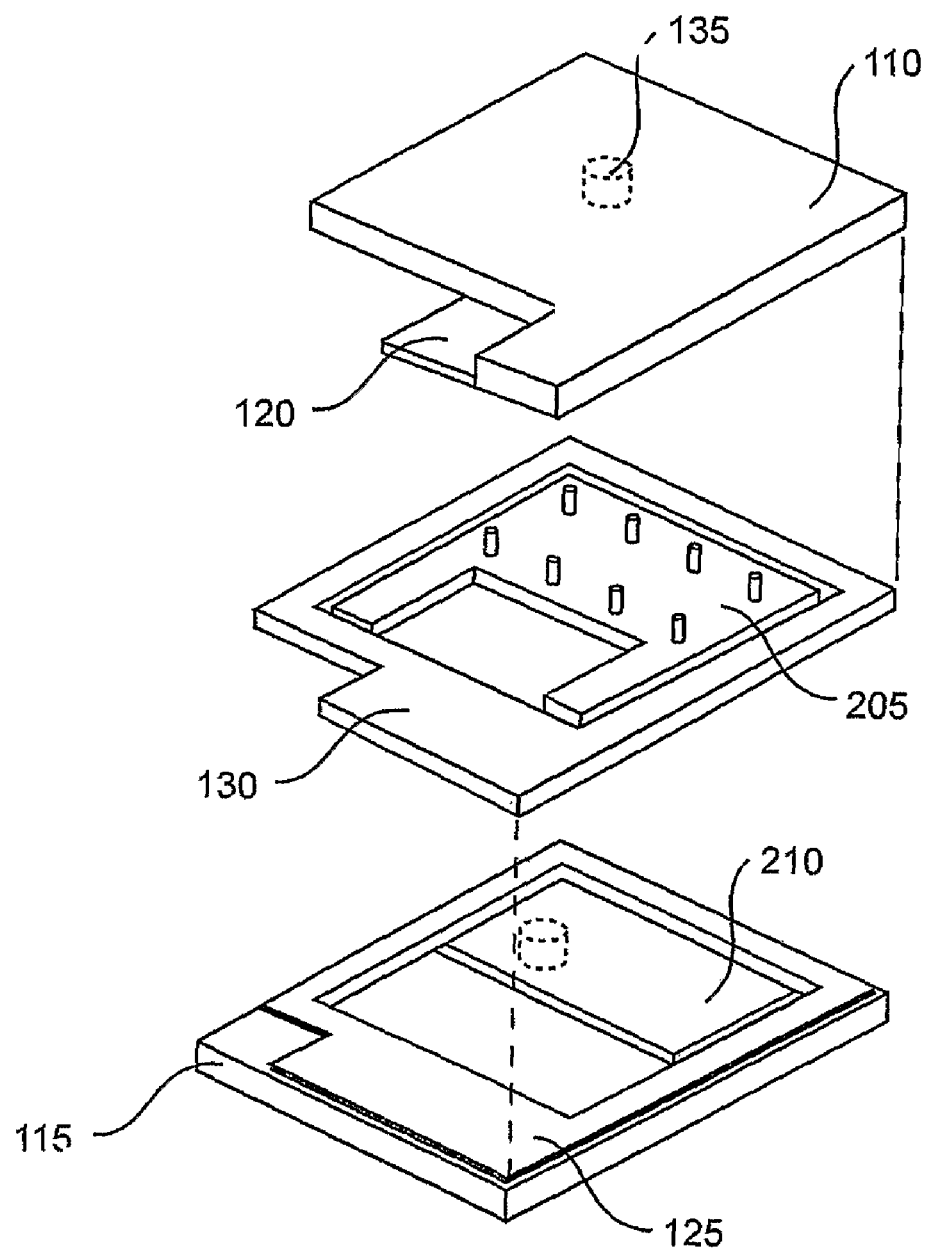
FIG. 2 is an assembly drawing of the silicon accelerometer sensor of FIG. 1.
Figure 3:
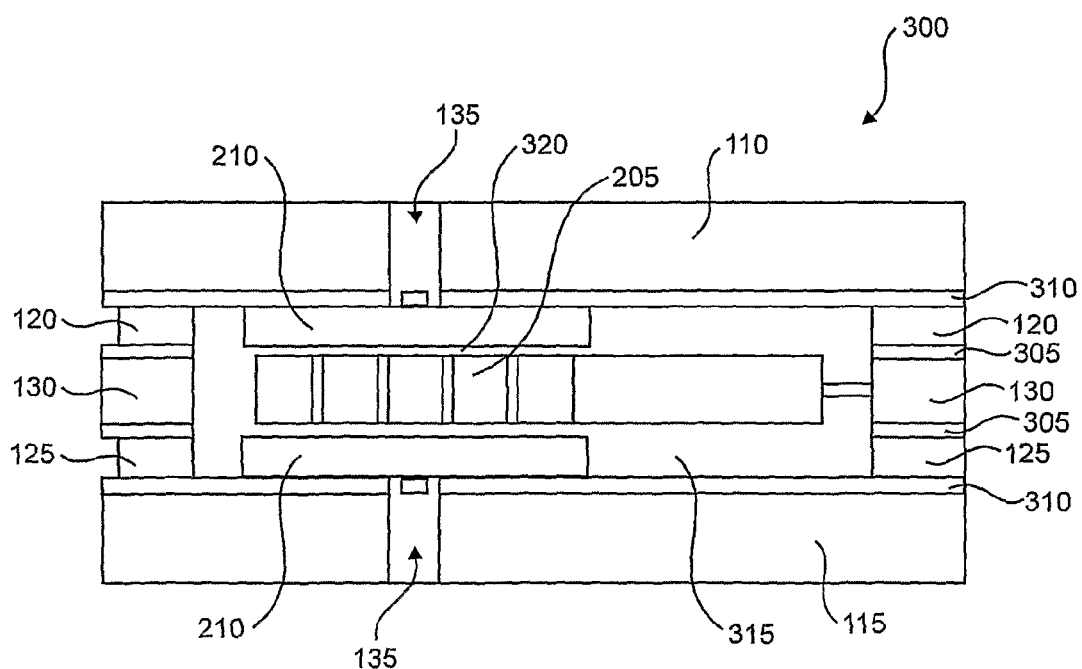
FIG. 3 is a side view of a silicon accelerometer sensor, according to one embodiment of the present invention.

FIG. 2 is an assembly drawing of the silicon accelerometer sensor 100 of FIG. 1. The assembly drawing shows the internal components of sensor 100. Contained within the proof mass layer 130 is a proof mass paddle 205 that may be coupled to the proof mass layer 130 by silicon hinges. On opposite sides of the paddle 205 are electrodes. FIGS. 2 and 3 show electrodes 210 contained within the guard layers 120 and 125 and parallel to one another. This configuration forms a capacitor between each electrode 210 and the paddle 205. In operation, the capacitance is used to determine the gap between the paddle 205 and each electrode 210. An electronic circuit supplies the proper voltage pulses to force the paddle to null, defined as the paddle position where both capacitances are equal.

FIG. 3 is a side view of a silicon accelerometer sensor 300, according to one embodiment of the present invention. The sensor 300 has an internal cavity 315 enclosed by layers 110-130. The internal cavity 315 houses the paddle 205 and electrodes 210, leaving a gap 320 between them. The sensor 300 also has a PM-G bond line 305 formed between the proof mass layer 130 and first and second guard layers 120 and 125. Similarly, the sensor 300 has a G-E bond line 310 formed between the guard layers 120 and 125 and the outside wafer layers 110 and 115, respectively.

To decrease the PM-G parasitic capacitance, the width of the bond line 305 between the proof mass and guard should be decreased. However, as the width of the bond line 305 is decreased, the bond strength is decreased, and the ruggedness and reliability of the chip may become compromised. Typically, the prior art width used for bond line 305 is 400 microns. This prior art width is a consequence of fabrication techniques used that does not account for the optimum width necessary to reduce parasitic capacitance and maintain reliable bond strength.

From a bond strength standpoint, the bond line 305 can be reduced substantially without compromising the reliability of the chip. Using a prior art bond line 305 of 400 microns, the sensor 300 can withstand a tensile force of about 50 lbs. Given the mass of the outside wafer layer 110 or 115 is 30 mg, the G loading would be about 700,000 G and the tensile strength of the oxide would be about 3400 PSI. On a number of sensors 300, the bonds do not necessarily delaminate, but the silicon breaks instead. Consequently, from a strength standpoint, the bond line 305 can be reduced by a factor of 2 to 4 without compromising the reliability of the chip.

Although a decrease in the width of the bond line 305 may not substantially affect the bond strength of the sensor 300, it may affect the hermeticity of the chip, either by increased leak failures or inherent permeability of the silicon dioxide. According to one embodiment of the present invention, a method for optimizing bond line 305 width for reduction of parasitic capacitance in MEMS accelerometers is provided.

Figure 4:
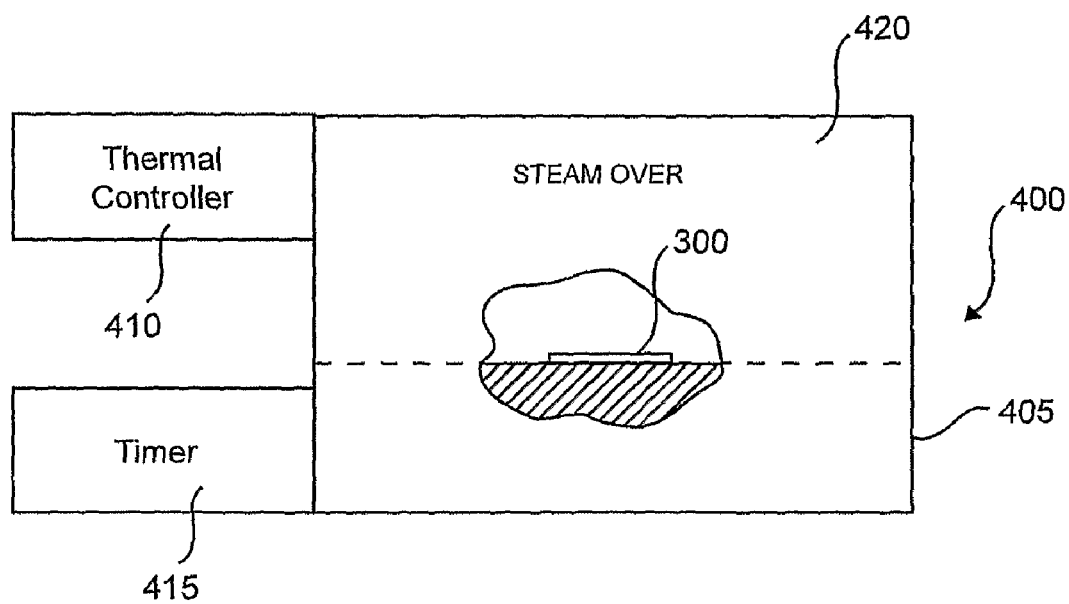
FIG. 4 is a schematic diagram showing a silicon accelerometer inside a steam oven in accordance with a method of the present invention.
Figure 5:
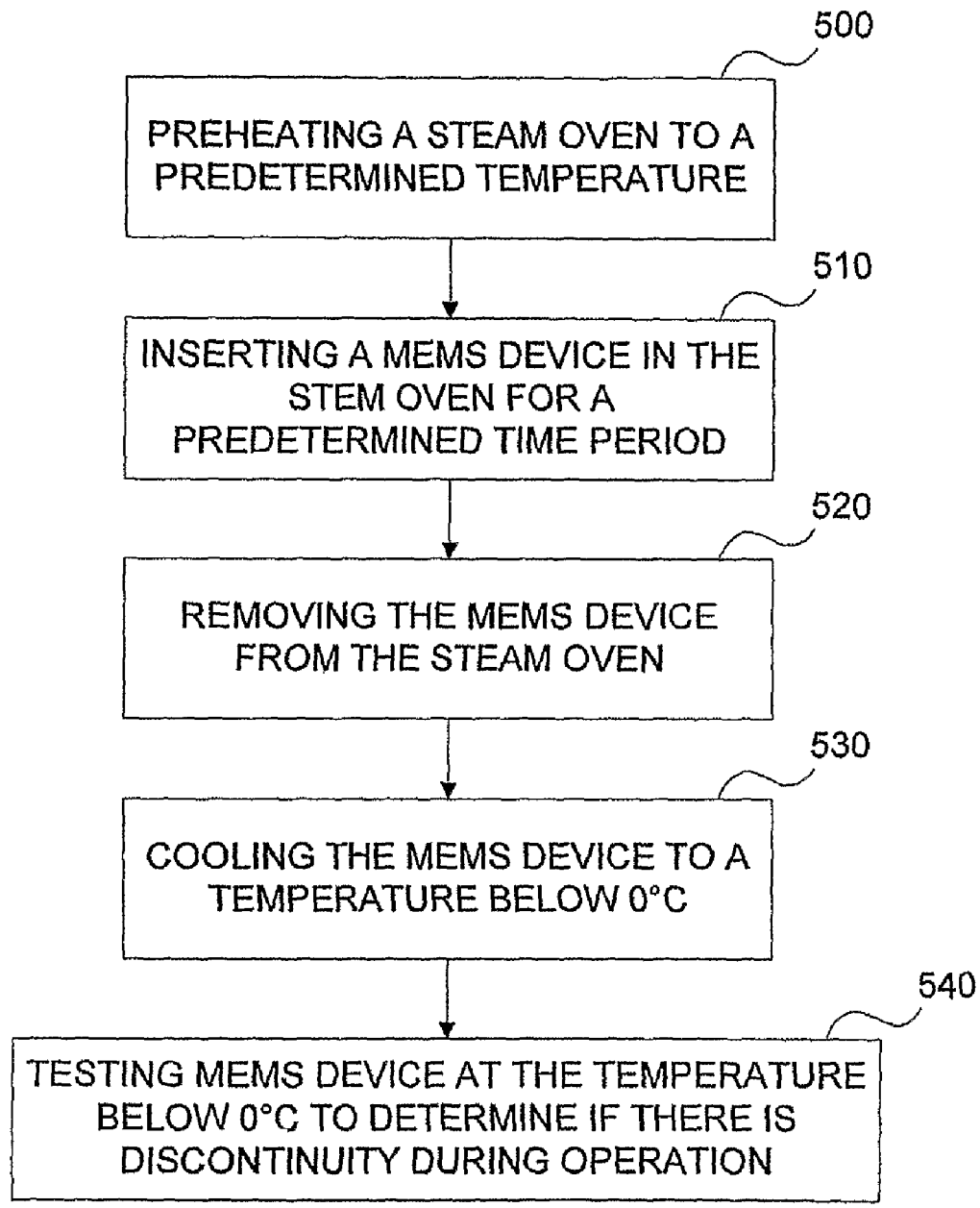
FIG. 5 is an exemplary flow chart depicting a method for bombing an accelerometer sensor with water vapor according to one embodiment of the present invention.

Referring to FIGS. 4 and 5, an application for practicing the method embodying the present invention, is generally designated 400. The sensor 300 is exposed to water vapor using a steam furnace or oven 405. Although a method utilizing an oven 405 is described herein, the method of the present invention applies equally to other steam producing sources.

According to a method embodying the present invention, the steam oven 405 is heated, at step 500, to an elevated temperature for evaporating water. For example, the temperature of the oven or furnace 405 can be preheated to approximately 100° C. A thermal controller 410 can be used to set the temperature of the steam oven 405, and a timer 415 can be used to set the period of exposure of the sensor 300 to the water vapor 420.

Once the steam oven 405 reaches the desired temperature, the MEMS device or sensor 300 is inserted, at step 510, for a desirable or predetermined period, for example, 24 hours. The period of exposure to the water vapor 420 is used in calculating the leak rate, which is discussed in detail below.

After bombing the MEMS device or sensor 300 with water vapor 420 for a specific period, the MEMS device is removed, at step 520, from the steam oven 405 and allowed to cool, at step 530, at a temperature below 0° C. In one embodiment, the MEMS device is cooled to a temperature of −55° C., as required by the military operational guidelines. At step 540, the MEMS device or sensor 300 is then tested at the temperature (below 0° C.) to determine if there is any discontinuity in performance of the device during operation.

Figure 6:
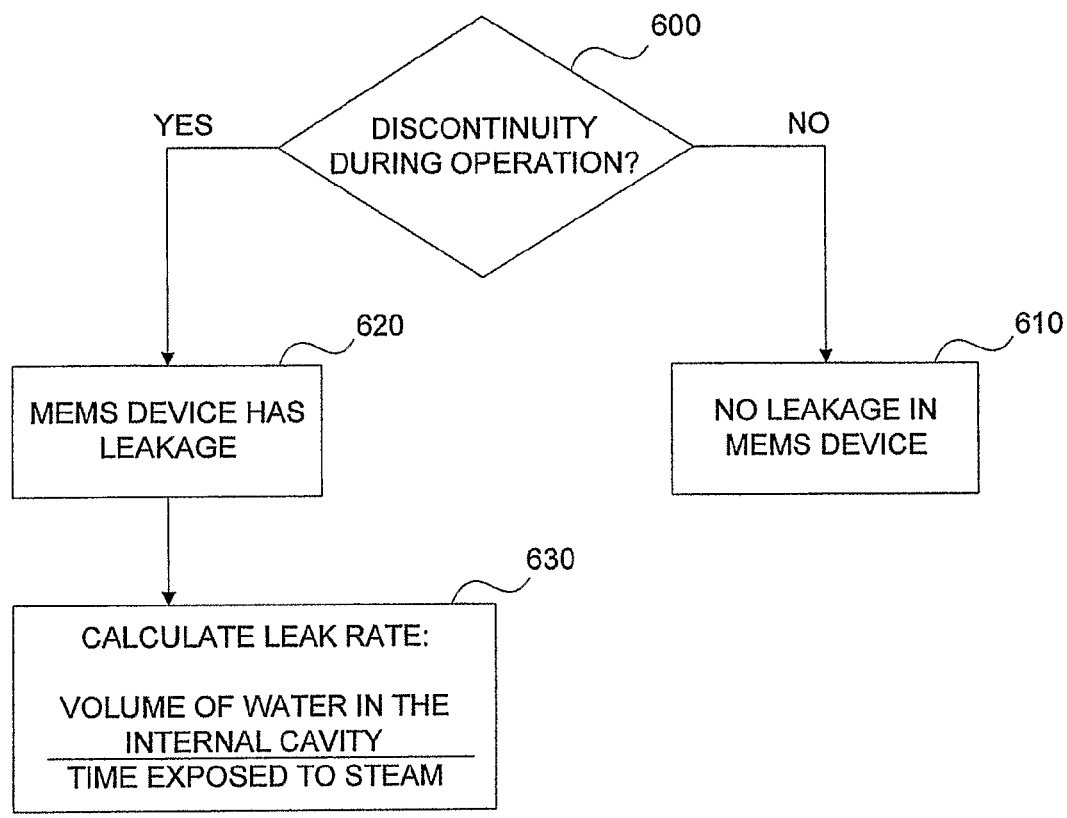
FIG. 6 is an exemplary flow chart depicting a method for determining leak rate of an accelerometer sensor according to one embodiment of the present invention.

Referring to FIG. 6, a method for determining leak rate of an accelerometer sensor 300 is provided in accordance with the present invention. When a MEMS device or sensor 300 is tested at a temperature below 0° C., for example −55° C., discontinuity during operation (Step 600) may occur. If the sensor 300 does not show any discontinuity during operation at −55° C., then the sensor 300 does not leak, at step 610, and consequently, the reduced width of bond line 305 does not compromise the reliability of the chip.

Conversely, at step 620, if there is a discontinuity in performance during operation, then the MEMS device or sensor 300 has a leak that allowed water vapor 420 to seep through and crystallize at lower temperature. Because the gap 320 between the paddle 205 and the electrodes 210 is about 2 microns, when the temperature is lowered to the −55° C. lower operating limit, even a very small vapor pressure in the sensor 300 will form an ice crystal or dendrite that blocks the motion of the paddle. This shows up as a discontinuity in the accelerometer test. At a temperature of −60° C., there is enough water in the chip to form a pillar of ice over 3 microns in diameter on both sides of the paddle 205.

At step 630, the leak rate can be calculated by dividing the volume of the sensor's internal cavity 315 by the water vapor bombing time period. The leak rate depends on (1) the temperature at which discontinuity occurs, and (2) the time and temperature at which a MEMS device is bombed with water vapor. For example, suppose a MEMS device is bombed with saturated steam at about 100° C. for 24 hours. If there is discontinuity at 0° C., it indicates that the vapor pressure of water in the MEMS device is above the equilibrium vapor pressure of ice or water at that temperature (4.58 mm of Hg). Given the volume of the internal cavity 315 of a sensor 300 is about 4.36 μL, the chip would contain about $2.6 \times 10^{-6}$ cm$^3$ of water. Since, the MEMS device was exposed for 24 hours, it would have accumulated that water in 86,400 seconds, so the leak rate would be $3 \times 10^{-10}$ cm$^3$/s.

Similarly, if the chip shows a discontinuity at −50° C., where the vapor pressure is 0.03 torr, then the leak rate is $2 \times 10^{-12}$ cm$^3$/s. These results show that the method embodying the present invention provides greater sensitivity than the prior art krypton bombing method.

It can be envisioned that bombing with water vapor 420 can be accomplished at a different time and temperature. For example, the bomb time or temperature could be increased. A temperature of 120° C. would approximately double the external water vapor pressure and a temperature of 180° C. would increase it 10 fold. Alternatively, the MEMS device can be cooled to a temperature even lower than −55° C. during testing.

One factor that should be taken into account at low temperatures, where the total amount of water condensing is low, is the possibility that all the water vapor 420 in the MEMS device could condense at some benign spot, so that the operation of the device would be unaffected. This may result in a false pass. However, based on experimental results obtained for low temperature failures, it appears that the gap 320 is a good nucleation area for the water vapor 420.

It is understood by a person skilled in the art that a sensor 300 can be fabricated with a combination of the prior art bond line 305 width of 400 microns with the reduced bond line 305 width of 100-200 microns. If this sensor 300 is subjected to water vapor bombing, at step 510, then any compromise of hermeticity with the reduced bond line 305 width could be determined statistically during operation testing, at step 540.

Although a decrease in the width of the bond line 305 may not substantially affect the bond strength of the sensor 300, it may affect the hermeticity of the chip, either by increased leak failures or inherent permeability of the silicon dioxide.

Although the hermeticity of a MEMS device depends on leak rates, it is also affected by inherent permeability of the silicon dioxide. Even if there is a perfect seal, permeation of water vapor 420 through the oxide may affect hermeticity. To determine the effect of permeation on the hermeticity of MEMS devices, permeation data were ascertained for Helium, Hydrogen, Deuterium and Neon at 700° C. At this temperature the permeation coefficient of Neon (the closest of the four to water in size) is about $1\times10^{-9}$ cm$^3$ mm/cm$^2$ sec cm of Hg. Hydrogen and Deuterium are about twice as large as Neon, while Helium is about 20 times as large as Neon. The permeation coefficient of Neon would be equivalent to a leak rate of about $10^{-9}$ cm$^3$/s.

If the MEMS device is bombed with water vapor 420 at a temperature of 100° C., the permeation constants would likely be several orders of magnitude lower than Neon at 700° C. Consequently, permeation through the oxide layer would not affect the hermeticity and reliability of a MEMS device with a reduced bond line 305 width of 100-200 microns. Even if permeation proved to be an issue for the long term stability of the MEMS device, it could be dealt with, for example, by filling the MEMS device with the same gas as the system housing the device.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other changes, combinations, omissions, modifications and substitutions, in addition to those set forth in the above paragraphs, are possible. For example, the present invention can also be used for other MEMS devices to eliminate spurious charge effects. Those skilled in the art will appreciate that various adaptations and modifications of the just described preferred embodiment can be configured without departing from the scope and spirit of the invention. Therefore, it is to be understood that, within the scope of the appended claims, the invention may be practiced other than as specifically described herein.

What is claimed is:

1. A method for testing wafer bond line width in a MEMS device, the MEMS device having at least a first and second wafer layer with a bond line between each wafer layer, the method comprising the steps of:
    exposing the MEMS device to a vaporized fluid for a predetermined time period at a first temperature, within a range of temperatures for evaporating the fluid;
    cooling the MEMS device to a second temperature, within a range of temperatures for freezing the fluid;
    testing the MEMS device by operating the device at a third temperature, within a range of temperatures for freezing the fluid, to determine if there is discontinuity in the performance of the device during operation of the device;
    if there is no discontinuity in performance during operation of the MEMS device, reducing the bond line width;
    exposing the MEMS device with the reduced bond line width to a vaporized fluid for a predetermined time period at the first temperature for evaporating the fluid;
    cooling the MEMS device to the second temperature for freezing the fluid; and
    operating the MEMS device at the third temperature for freezing the fluid in order to determine if there is discontinuity in performance of the device during operation;
    wherein presence or absence of a discontinuity in performance during operation of the MEMS device indicates the wafer bond line is leaking, or is not leaking, respectively.

2. The method of claim 1, wherein the fluid is water.

3. The method of claim 1, wherein the second temperature is approximately equal to the third temperature.

4. The method of claim 1, wherein the first temperature is approximately 100° C.

5. The method of claim 1, wherein the second temperature is approximately −55° C.

6. The method of claim 1, wherein the second temperature is approximately below 0° C.

7. The method of claim 1 further comprising, if there is discontinuity in performance during operation of the MEMS device, calculating leak rate of the vaporized fluid through the bond line by dividing volume of the MEMS device internal cavity by the predetermined time period the MEMS device was exposed to a vaporized fluid at the first temperature.

8. The method of claim 7 further comprising the step of determining whether the calculated leak rate is an acceptable design parameter by comparison to standard permeation coefficients for various gases.

9. The method of claim 8 further comprising the step of replacing a leaking bond line with a bond line having a different width to achieve an acceptable leak rate design parameter.

10. The method of claim 1 wherein the step of reducing the bond line width results in a bond line between the first and second wafer layers less than 400 microns wide.

11. The method of claim 1 wherein the step of reducing the bond line width results in a bond line approximately 100-200 microns wide.

12. The method of claim 1 wherein the bond line in the MEMS device seals an internal cavity between the first and second wafer layers around its periphery.

* * * * *